(12) United States Patent
Ito et al.

(10) Patent No.: US 6,617,933 B2
(45) Date of Patent: Sep. 9, 2003

(54) VCO CIRCUIT WITH WIDE OUTPUT FREQUENCY RANGE AND PLL CIRCUIT WITH THE VCO CIRCUIT

(75) Inventors: Yoshiaki Ito, Hyogo (JP); Yoshiyuki Ota, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/884,931

(22) Filed: Jun. 21, 2001

(65) Prior Publication Data

US 2002/0039051 A1 Apr. 4, 2002

(30) Foreign Application Priority Data

Sep. 29, 2000 (JP) ........................ 2000-298413

(51) Int. Cl.[7] ............................................... H03L 7/00
(52) U.S. Cl. .............................. 331/25; 331/74; 331/34
(58) Field of Search .............................. 331/25, 18, 74, 331/34, 57

(56) References Cited

U.S. PATENT DOCUMENTS

| | | | |
|---|---|---|---|
| 5,175,512 A | | 12/1992 | Self |
| 5,233,314 A | * | 8/1993 | McDermott et al. ........ 327/157 |
| 5,412,349 A | * | 5/1995 | Young et al. ................ 331/1 A |
| 5,426,398 A | * | 6/1995 | Kuo ............................. 331/57 |
| 5,666,088 A | | 9/1997 | Penza |
| 5,936,478 A | | 8/1999 | Lee et al. |
| 6,072,345 A | | 6/2000 | Ooishi |
| 6,157,180 A | * | 12/2000 | Kuo ............................. 323/282 |

FOREIGN PATENT DOCUMENTS

| | | |
|---|---|---|
| JP | 7-321649 | 12/1995 |
| JP | 9-200001 | 7/1997 |
| JP | 10-200382 | 7/1998 |
| TW | 364664 | 7/1999 |

OTHER PUBLICATIONS

"Adaptive Bandwith DLLs and PLLs Using Regulated Supply CMOS Buffers", Sidiropoulos et al., 2000 Symposium on VLSI Circuits Digest of Technical Papers.

* cited by examiner

Primary Examiner—Robert Pascal
Assistant Examiner—Kimberly E Glenn
(74) Attorney, Agent, or Firm—Burns, Doane, Swecker & Mathis, LLP

(57) ABSTRACT

A voltage-controlled oscillating circuit according to the present invention includes: a bias voltage generating circuit outputting a bias voltage according to a control voltage; and a ring oscillator circuit receiving supply of the bias voltage to operate. The bias voltage generating circuit generates the bias voltage using a feedback circuit formed by an operational amplifier receiving supply of a power source voltage to operate. Therefore, an influence of a high frequency component overlapped on the power source voltage, that is an influence of noise, is suppressed, thereby enabling stable generation of an output clock having a small variation in phase.

20 Claims, 8 Drawing Sheets

VCO CIRCUIT WITH WIDE OUTPUT FREQUENCY RANGE AND PLL CIRCUIT WITH THE VCO CIRCUIT

BACKGROUND OF THE INVENTION

1. Field of the Invention

The present invention relates to a voltage-controlled oscillating circuit, and more particularly, to a voltage-controlled oscillating circuit capable of altering an oscillating frequency according to a control voltage and to a phase-locked loop circuit, a so-called PLL circuit, equipped with the voltage-controlled oscillating circuit.

2. Description of the Background Art

In order to cooperatively operate a plurality of internal circuits implemented on the same system, employed are phase-locked loop circuits (PLL circuit) each generating a synchronized clock. Especially, in recent years, an LSI (Large Scale Integrated Circuit) has experienced progress toward its higher speed operation in company with miniaturization; as a result, a margin in phase shift between a clock of the entire system on which an LSI is implemented and an internal clock of the LSI has become narrowed, which in turn, has enhanced a chance of usage of a PLL circuit to compensate a phase shift.

As a result, many of PLL circuits are required to be incorporated, which leads to increase in design load in order to output synchronized clocks corresponding to a wide frequency range. Accordingly, it is important to make an output frequency range (lock range) of a PLL circuit as wide as possible and thereby, cover a necessary frequency range with a single PLL circuit.

Since a lock range of a PLL circuit is largely dependent on an output frequency range of a voltage-controlled oscillator included, it is important to ensure a wide output frequency range of the voltage-controlled oscillating circuit. A general configuration of such a voltage-controlled oscillating circuit is shown, for example in FIG. 2 of Japanese Patent Laying-Open No. 9-200001(1997). The general configuration of a voltage-controlled oscillating circuit disclosed in the publication is hereinafter referred to the prior art.

FIG. 12 is a circuit diagram representing a configuration of the prior art voltage-controlled oscillating circuit 70.

Referring to FIG. 12, the voltage-controlled oscillating circuit 70 has a ring oscillator constructed from inverters at three stages. The ring oscillator includes: an inverter formed of a P-channel transistor 51a and an N-channel transistor 51b; an inverter formed of a P-channel transistor 52a and an N-channel transistor 52b; and an inverter formed of a P-channel transistor 53a and an N-channel transistor 53b. Capacitors 51c, 52c and 53c to determine a delay value of the ring oscillator are coupled with output nodes of the respective inverters.

The voltage-controlled oscillating circuit 70 includes: a P-channel transistor 54 receiving a fixed voltage Vf at the gate thereof; a P-channel transistor 55 receiving a control voltage Vc at the gate thereof; and N-channel transistors 56 and 57 constituting a current mirror circuit.

The voltage-controlled oscillating circuit 70 further includes: P-channel transistors 59, 60 and 61 each, coupled between a corresponding one of the inverters at three stages and a power source node supplying a power source voltage Vdd, and for controlling operating currents supplied to the respective inverters; and a transistor 58 constituting a current mirror circuit together with the transistor 59.

The voltage-controlled oscillating circuit 70 still further includes: N-channel transistors 62, 63 and 64 each, coupled between a corresponding one of ground nodes supplying a ground voltage Vss and a corresponding one of the inverters.

In the voltage-controlled oscillating circuit 70, the ring oscillator constituted of the inverters at three stages performs an oscillating operation. An oscillating frequency of the ring oscillator is determined in the following way.

Into the transistor 56, there flows the sum of a current flowing between the drain and source of the transistor 54 receiving the fixed voltage Vf at the gate thereof and a current flowing between the drain and source of the transistor 55 receiving the control voltage Vc at the gate thereof. The current flowing between the drain and source of the transistor 55 is controlled by the controlled voltage Vc.

Since the transistors 56 and 57 constitute a current mirror circuit, currents equal to each other flow through the respective transistors 56 and 57 and the current of the transistor 57 flows through the transistor 58. Since the transistors 58 and 59 constitute a current mirror circuit, duplicated current flows through the transistor 59. Furthermore, into the P-channel transistors 60 and 61 for current controlling, there flow currents proportional to respective size ratios of the transistors 60 and 61 to the transistor 59 (or the transistor 58). Likewise, into the N-channel transistors 62, 63 and 64 for current controlling, there flow currents proportional to respective size ratios of the transistors 62, 63 and 64 to the transistor 57 (or the transistor 56).

In such a configuration, an oscillating frequency is determined by operating currents flowing through the respective inverters at three stages constituting the ring oscillator and values of the delay capacitors 51c, 52c and 53c. The capacitors 51c, 52c and 53c determine delay times at the respective stages as load capacitances of the respective inverters constituting the ring oscillator.

Hence, an oscillating frequency of the voltage-controlled oscillating circuit 70 is altered by changing the control voltage Vc inputted to the gate of the transistor 55 to change each of operating currents flowing through the respective inverters constituting the ring oscillator. Furthermore, since operating currents flowing through the respective inverters of the ring oscillator are also altered by changing a set value of the fixed voltage Vf inputted to the transistor 54; therefore, an oscillating frequency differs under the same control voltage Vc applied. In other words, obtained are a plurality of oscillating frequency vs. control voltage Vc characteristics with a fixed voltage Vf as a parameter.

However, the prior art voltage-controlled oscillating circuit 70 determines operating currents for the respective inverters constituting the ring oscillator through voltage to current conversion according to the inputted control voltage Vc. As a result, a clock CLKO having an oscillating frequency corresponding to operating currents of the inverters is outputted from the ring oscillator.

Therefore, since a configuration is adopted of controlling an oscillating operation of the ring oscillator by a current value, it is difficult to broaden an oscillating frequency range. For this reason, it is also difficult to realize a PLL with a wide lock range even if a PLL circuit is constructed using such as voltage-controlled oscillating circuit.

Moreover, as a typical cause for jitter (phase deviation) occurring in a clock generated by the PLL circuit, there can be named noise on a power source voltage pulse (hereinafter simply referred to as power source noise).

At this point, referring again to FIG. 12, when noise occurs in the power source voltage Vdd supplied by the power source node, source voltages of the current control P-channel transistors 58, 59, 60 and 61 are directly varied; therefore, an influence of the power source noise is directly exerted on operating currents for the inverters constituting the ring oscillator, with the result that an oscillating frequency of the voltage-controlled oscillating circuit 70 is also affected directly by the power source noise.

Therefore, a regulator circuit or a filter circuit for reducing power source noise was required for use of the prior art voltage control oscillating circuit 70.

FIG. 13 is a circuit diagram representing a configuration of a filter circuit provided correspondingly to a power source voltage of the voltage-controlled oscillating circuit 70.

Referring to FIG. 13, a filter circuit 71 includes: a smoothing capacitance 72 coupled between the power source node 75 and the ground node supplying the ground voltage Vss; and a resistance element 73 coupled in series with the power source node 75. The filter circuit 71 prevents a high frequency component superimposed on the power source Vdd, that is noise, from being transmitted to the power source node 75 using a low pass filter formed by the smoothing capacitance 72 and the resistance element 73.

However, in the case where such a filter circuit 71 is employed, a voltage level of the power source node 75 drops when a value of the resistance element 73 is large. Hence, in order that a cut-off frequency determined by a product of a resistance value of the resistance element 71 and a capacitance value of the smoothing capacitance 72 is made sufficiently low, a capacitance value of the smoothing capacitance 72 has to be larger. As a result, an occupancy area of the smoothing capacitance 72 increases, which produces a problem that layout design becomes limited.

SUMMARY OF THE INVENTION

It is an object of the present invention to provide configurations of a voltage-controlled oscillating circuit having a wide output frequency range and capable of suppressing an influence of power source noise and of a phase-locked loop circuit equipped with the voltage-controlled oscillating circuit.

The present invention will be summarized as follows: According to a first aspect of the present invention, the present invention is directed to a voltage-controlled oscillating circuit receiving supply of a power source voltage to operate and comprises: a voltage generating circuit; and a ring oscillator circuit. The voltage generating circuit sets a voltage level of a bias voltage according to a control voltage inputted from outside. The voltage generating circuit includes: an operational amplifier, which is an amplifier of a single-stage configuration, and receiving supply of the power source voltage to operate. The operational amplifier has: first and second input terminals electrically coupled with one of the control voltage and a reference voltage and the other of the voltages, respectively; and an output terminal outputting the bias voltage. The voltage generating circuit further includes: a feedback circuit coupled between the output terminal and one of the first and second input terminals. The ring oscillator circuit generates a clock having a frequency corresponding to the bias voltage. The ring oscillator circuit has an odd-number of inverters, interconnected in a closed ring, and each inverter receiving supply of the bias voltage to operate.

Hence, a main advantage of the present invention is in that an oscillating frequency of the ring oscillator is controlled by the bias voltage generated by the voltage generating circuit including a single-stage operational amplifier excellent in frequency characteristics; therefore, there can be realized a voltage-controlled oscillating circuit excellent in frequency characteristics and capable of generating a clock with a small variation in phase in a stable way.

According to a second aspect of the present invention, the present invention is directed to a voltage-controlled oscillating circuit receiving a power source voltage to operate and comprises: a voltage generating circuit; and a ring oscillator circuit. The voltage generating circuit receives a control voltage and amplifies the control voltage at a prescribed amplification factor to generate a bias voltage of a voltage level different from that of the control voltage. The ring oscillator circuit generates a clock having a frequency according to that of the bias voltage. The ring oscillator circuit has an odd number of inverters interconnected in a closed ring and receives supply of the bias voltage at each of the converters to operate.

Hence, in the voltage-controlled oscillating circuit according to the present invention, an oscillating frequency of the ring oscillator is controlled by the bias voltage generated by the voltage shifting circuit including the operational amplifier. Therefore, an adverse influence due to power source noise can be suppressed to perform stable generation of a clock having a small variation in phase.

According to a third aspect of the present invention, the present invention is directed to a phase-locked loop circuit generating an output clock for operating an internal circuit in synchronism with a reference clock and comprises: a phase comparator circuit; a control circuit; and a voltage-controlled oscillating circuit. The phase comparator circuit compares the reference clock with a feedback clock from the internal clock. The control circuit sets a voltage level of a control voltage based on a phase comparison result of the phase comparator circuit. The voltage-controlled oscillating circuit receives supply of a power source voltage to operate and supply the output clock having a frequency according to the control voltage to the internal circuit. The voltage-controlled oscillating circuit includes: a voltage generating circuit setting a voltage level of a bias voltage according to the control voltage. The voltage generating circuit has: an operational amplifier, which is an amplifier of a single-stage configuration, and receiving supply of the power source voltage to operate. The operational amplifier has: first and second input terminals electrically coupled with one of the control voltage and a reference voltage and the other of the voltages, respectively; and an output terminal outputting the bias voltage. The voltage generating circuit further includes: a feedback portion coupled between the output terminal and one of the first and second terminals. The voltage-controlled oscillating circuit further includes: a ring oscillator circuit generating a clock, as the output clock, having a frequency according to that of the bias voltage. The ring oscillator circuit has: an odd-number of inverters, interconnected in a closed ring, and each inverter receiving supply of the bias voltage to operate.

Furthermore, a phase-locked loop circuit according to the present invention controls an oscillating frequency of an output clock of the voltage-controlled oscillating circuit with the bias voltage generated by the voltage generating circuit including the operational amplifier excellent in frequency characteristics. Therefore, an adverse influence can be suppressed that would otherwise be exerted on the output clock by power source noise without affecting stability of the entire phase-locked loop circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Detailed description will be given of embodiments of the present invention below with reference to the accompanying drawings. Note that the same symbols used in views of the drawings indicate the same or corresponding constituents.

First Embodiment

Figure 1:
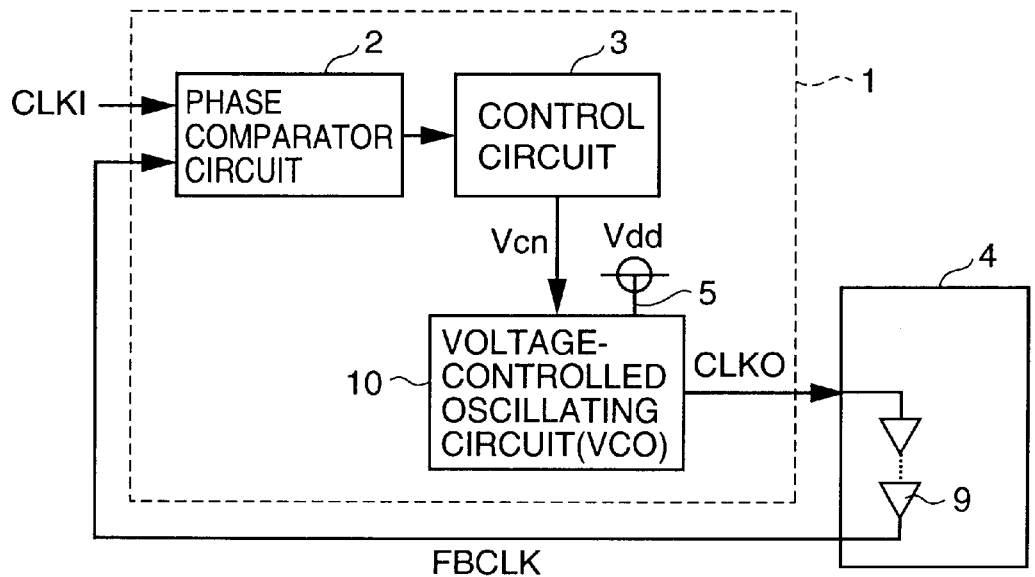
FIG. 1 is a schematic block diagram showing a configuration of a phase-locked loop circuit 1 according to an embodiment of the present invention.

Referring to FIG. 1, a phase-locked loop circuit 1 according to the embodiment of the present invention controls an output clock CLKO supplied to an internal circuit 4 such that a feedback clock FBCLK fedback from the internal circuit 4 and an input clock CLKI are synchronized with each other. By doing so, a delay occurring in the internal circuit 4 is compensated and the internal circuit 4 can be operated in synchronism with the input clock CLKI.

The phase-locked loop circuit 1 includes: a phase comparator circuit 2 comparing the input clock CLKI and the feedback clock FBCLK; a control circuit 3 outputting a control voltage Vcn according to a phase comparison result of the phase comparator circuit 2; and a voltage-controlled oscillating circuit 10 generating an output clock CLKO having an oscillating frequency according to the control voltage Vcn. The voltage-controlled oscillating circuit 10 receives supply of a power source voltage Vdd from a power source line 5 to operate.

The output clock CLKO is supplied to the internal circuit 4 as an operating clock. The output clock CLKO is supplied to the phase comparator circuit 2 via one or more driver circuits 9 in the internal circuit 4 as a feedback clock FBCLK. Note that the output clock CLKO can also be used directly as the feedback clock FBCLK without passing through the driver circuit or circuits 9.

Figure 2:
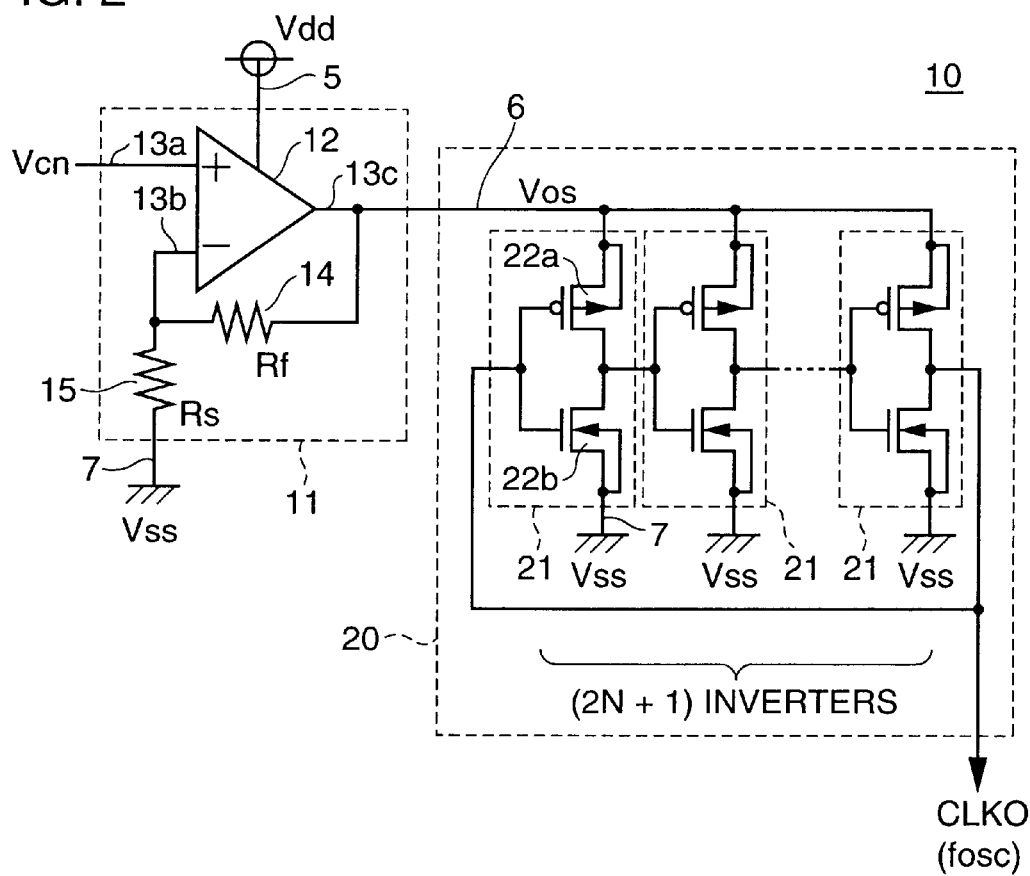
FIG. 2 is a circuit diagram representing a configuration of a voltage-controlled oscillating circuit 10 in the embodiment.

Referring to FIG. 2, the voltage-controlled oscillating circuit 10 includes: a bias voltage generating circuit 11 outputting a bias voltage Vos according to the control voltage Vcn; and a ring oscillator circuit 20 receiving supply of the bias voltage Vos to operate.

The ring oscillator circuit 20 has (2n+1) inverters 21 wherein n is a natural number, coupled in series. The inverters are interconnected in a closed ring and an output of an inverter at the final stage is fedback to the input node of an inverter at the first stage. The inverters 21 each receive the bias voltage Vos from a bias voltage line 6 and the ground voltage Vss from a ground line 7 and operate. The inverters 21 each have a pair of a P-channel transistor 22a and an N-channel transistor 22b, which complimentarily turn on/off.

A frequency fosc of the output clock CLKO outputted by the ring oscillator circuit 20 is given by fosc=1/((2n+1) (Th+Tl)), wherein Th indicates a rise time of the transistor 22a constituting each of the inverters and Tl a fall time of the transistor 22b constituting each of the inverters. The rise time Th and fall time Tl of the respective transistors 22a and 22b alter according to change in the bias voltage Vos. As a result, the oscillating frequency fosc is controlled according to a voltage level of the bias voltage Vos.

The bias voltage generating circuit 11 includes: an operational amplifier 12 receiving supply of the power source voltage Vdd to operate; a resistance element 14 coupled between an output terminal 13c and inverting input terminal 13b of the operational amplifier 12; and a resistance element 15 coupled between the inverting input terminal 13b and the ground line 7. Resistance values of the resistance elements 14 and 15 are indicated by Rf and Rs, respectively.

The control voltage Vcn from the control circuit 3 is inputted to a non-inverting terminal 13a of the operational amplifier 12. The output terminal 13c of the operational amplifier 12 is coupled with a bias voltage line 6 supplying the bias voltage Vos.

With such a configuration adopted, the bias voltage generating circuit 11 operates as a non-inverting amplifier circuit using an operational amplifier. Hence, the bias voltage Vos is given by a formula (1) shown below.

$$Vos = (1 + Rf/Rs) \cdot Vcn \quad (1)$$

Hence, the bias voltage generating circuit 11 amplifies the control voltage Vcn at an amplification factor equal to or more than 1, which is determined by a ratio in resistance value between the resistance elements 14 and 15, to generate the bias voltage Vos. Therefore, when the bias voltage Vos is altered from the ground voltage Vss to the power source voltage Vdd, a range of the oscillating frequencies fosc of the ring oscillator circuit 10 can be made wide. Thereby, a lock range of the phase-locked loop circuit 1 on which the voltage controlled oscillating circuit 10 is implemented becomes also wide.

Furthermore, the bias voltage Vos receives no direct influence of noise-caused fluctuations in voltage level of the power source voltage Vdd on the power source line 5. Accordingly, an influence of power source noise is suppressed and the output clock CLKO with a low level variation in phase can be stably generated without providing a large scaled filter circuit.

An operational amplifier generally employed is of a multi-stage configuration in which an amplification factor is highly thought of, typically, a two-stage configuration. In contrast to this, the operational amplifier 12 used in the embodiment of the present invention is of a single-stage configuration having a lower gain, but being more excellent in frequency characteristics than that of the multi-stage configuration.

Figure 3:
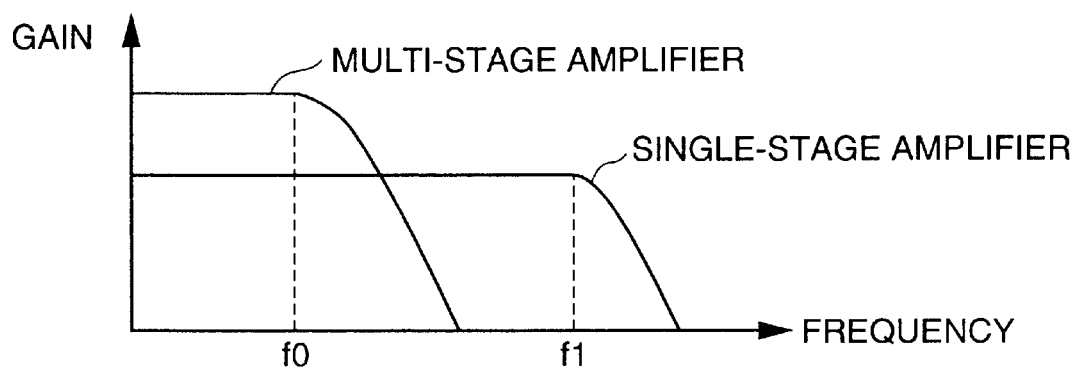
FIG. 3 is a conceptual diagram representing frequency characteristics of operational amplifiers.

In FIG. 3, a conceptual diagram for representing frequency characteristics of operational amplifiers is shown. In a case where the operational amplifier 12 is not of a multi-stage configuration, but of a single-stage configuration, a range in which an amplifying operation can be stably performed in a practical sense is extended toward the high frequency side as indicated by f0→f1 in FIG. 3. In such a way, with employment of an amplifier of a single-stage configuration excellent in frequency characteristics, a voltage-controlled oscillating circuit excellent in frequency characteristics can be designed.

Note that as shown in FIG. 1, the phase-locked loop circuit 1 on which the voltage-controlled oscillating circuit is implemented constitutes a feedback system; therefore, it is necessary to sufficiently take stability of the entire system into consideration. While the present invention has an object to improve characteristics of a voltage-controlled oscillating circuit using an operational amplifier, there will arise a risk of adversely affecting stability of the entire phase-locked loop circuit due to the configuration including an operational amplifier adopted when a frequency characteristic of a voltage-controlled oscillating circuit is deteriorated down to a level which cannot be neglected as compared with other circuits in the phase-locked loop circuit 1, especially with the control circuit 3, with the result that there arise a need of a margin for ensuring stability, leading to loss of feasibility in designing a PLL circuit.

Hence, in order to compatibly achieve both aspects of the object of the present invention: improved characteristics of a voltage-controlled oscillating circuit and ensured stability of the entire phase-locked loop circuit, it is desirable that an operating amplifier of a single-stage configuration is used in a voltage-controlled oscillating circuit and thereby, an influence of frequency characteristics of the voltage-controlled oscillating circuit exerting on stability of the phase-locked loop circuit can be neglected.

Second Embodiment

Figure 4:
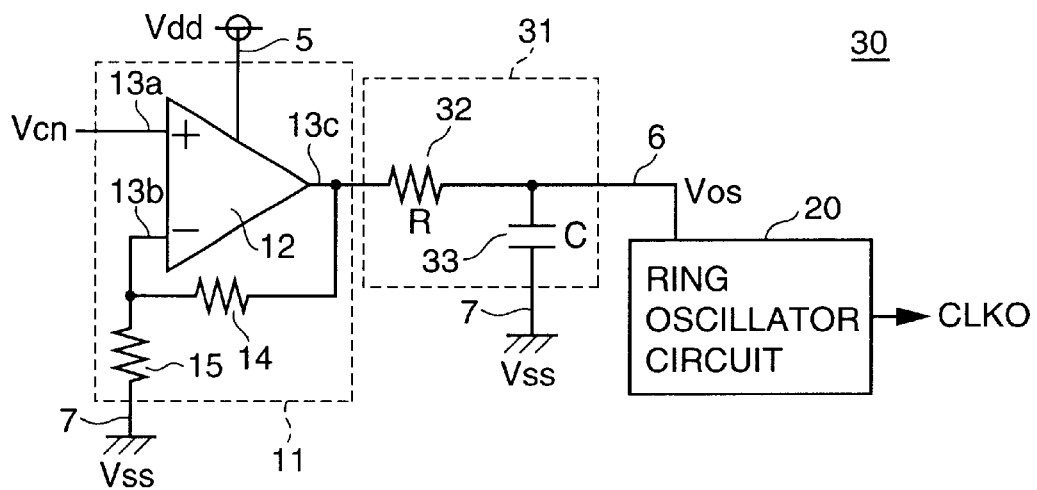
FIG. 4 is a block diagram representing a configuration of a voltage-controlled oscillating circuit 30 according to a second embodiment of the present invention.

Referring to FIG. 4, a voltage-controlled oscillating circuit 30 according to the second embodiment of the present invention differs from the voltage-controlled oscillating circuit 10 shown in FIG. 2 in that the circuit 30 further includes: a filter circuit 31 coupled with the bias voltage line 6.

The filter circuit 31 has a resistance element 32 coupled in series with the bias voltage line 6; and a capacitor 33 coupled between the bias voltage line 6 and the ground line 7. If a resistance value of the resistance element 32 and a capacitance value of the capacitor 33 are R and C, respectively, by definition, a cut-off frequency of the filter circuit is given by $fc=1/(2\pi \cdot R \cdot C)$. The filter circuit 31 is provided in order to remove a high frequency component of the bias voltage Vos, that is noise, and further stabilize an oscillating frequency fosc of the ring oscillator circuit 20. A configuration and operation of the other constituents combined of the voltage-controlled oscillating circuit 30 are similar to the case of the voltage-controlled oscillating circuit 10 shown in FIG. 2; therefore, neither of detailed descriptions thereof is repeated.

Figure 5:
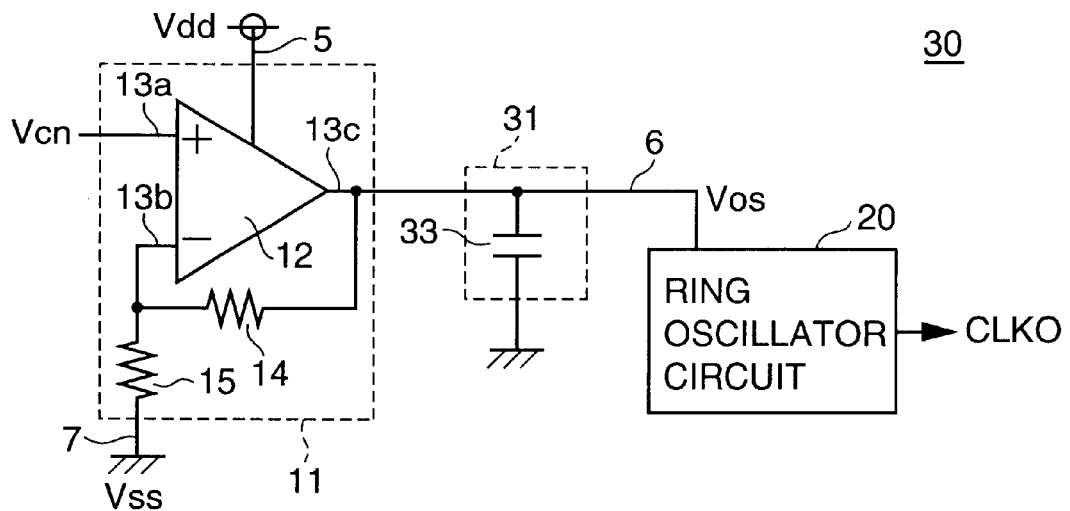
FIG. 5 is a circuit diagram for representing another example configuration of a filter circuit 31.

Referring to FIG. 5, the filter circuit 31 can be constituted of the capacitor 33 coupled between the bias voltage line 6 and the ground line 7. By forming the filter circuit 31 with the capacitor 33 only, a drop in voltage level of the bias voltage Vos can be prevented to ensure a wider oscillating frequency range.

Third Embodiment

Figure 6:
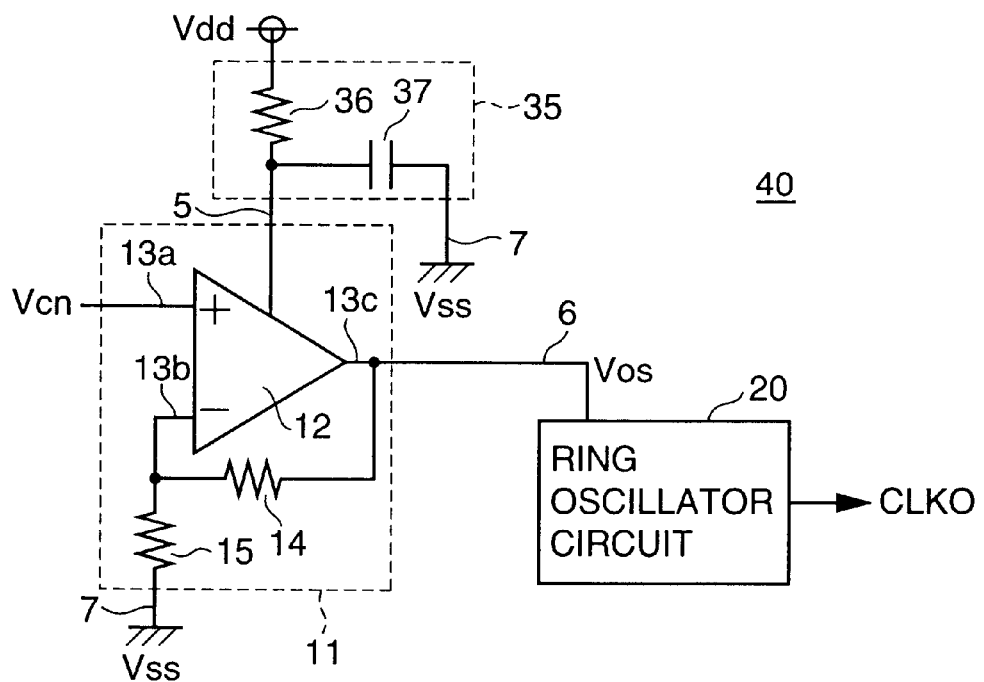
FIG. 6 is a block diagram representing a configuration of a voltage-controlled oscillating circuit 40 according to a third embodiment of the present invention.

Referring to FIG. 6, a voltage-controlled oscillating circuit 40 according to the third embodiment of the present invention differs from the voltage-controlled oscillating circuit 10 shown in FIG. 2 in that the circuit 40 further includes: a filter circuit 35 coupled with the power source line 5 in addition to the configuration of the circuit 10.

The filter circuit 35 is a low pass filter including: a resistance element 36 coupled in series with the power source line 5; and a capacitor 37 coupled between the power source line 5 and the ground line 7. The filter circuit 35 is provided in order to remove noise in the power source voltage Vdd supplied to the operational amplifier 12. A configuration and operation of the other constituents combined of the voltage-controlled oscillating circuit 40 are similar to the voltage-controlled oscillating circuit 10; therefore, neither of detailed descriptions thereof is repeated.

Next, description will be given of an influence of power source noise in operation of the operational amplifier 12 using FIGS. 7A to 7D.

Figure 7A:
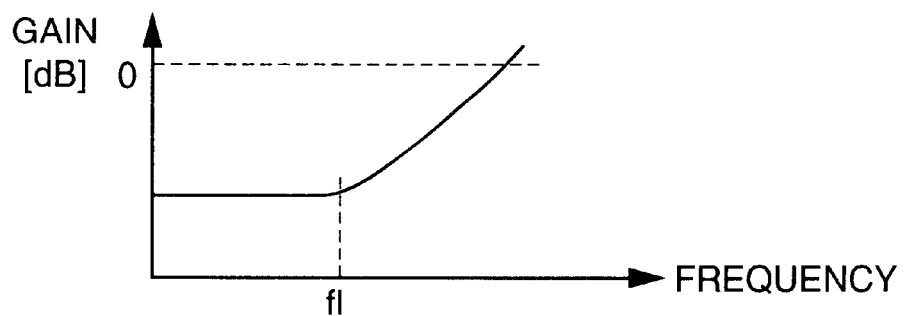
FIGS. 7A to 7D are conceptual diagrams describing an influence of power source noise in operation of an operational amplifier 12.

In FIG. 7A, shown is a frequency response amplified by a feedback operation of the operational amplifier. Referring to FIG. 7A, a high frequency component of fl or higher is amplified by the feedback operation of the operational amplifier.

Figure 7B:
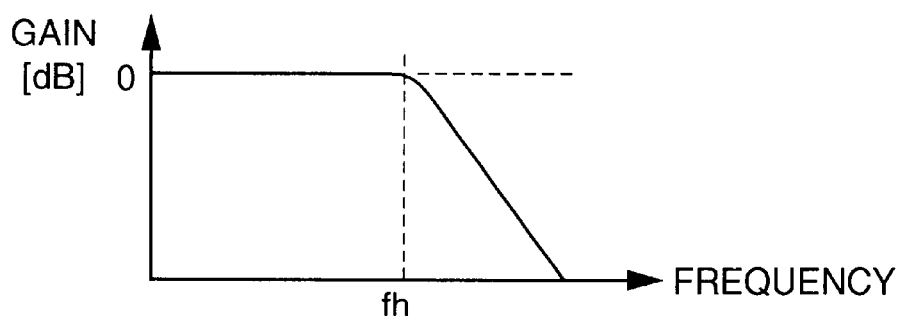
Figure 7C:
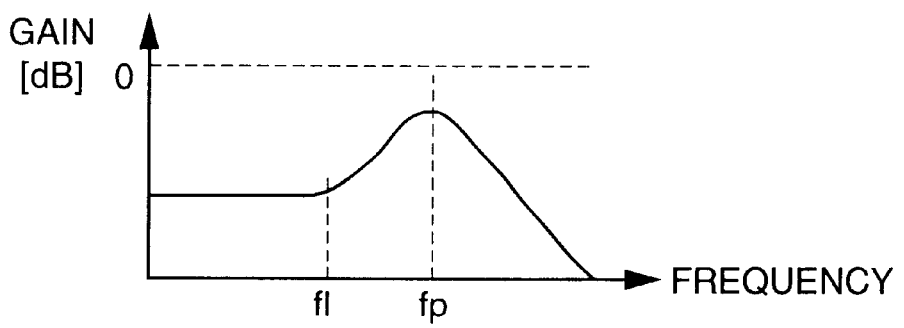

In FIG. 7B, shown is an attenuation characteristic of a high frequency component in the operational amplifier. Referring to FIG. 7B, a frequency component of fh or higher is attenuated. Hence, in combination of the frequency characteristics shown in FIGS. 7A and 7B, a frequency characteristic of the bias voltage generating circuit 11 using the operational amplifier 12 is given as shown in FIG. 7C. In such a way, the frequency response of the bias voltage generating circuit 11 comes to have a peak frequency fp due to a difference between the frequency response caused by a feedback operation of the operational amplifier and the attenuation characteristic of a high frequency component therein.

Figure 7D:
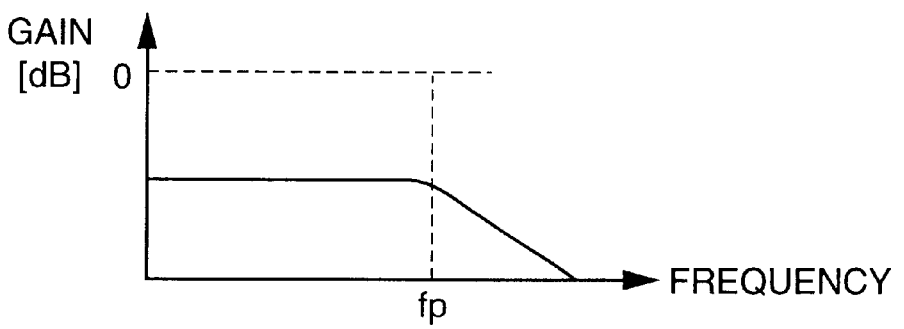

Accordingly, in order to make a frequency characteristic of the bias voltage generating circuit 11 smooth as shown in FIG. 7D, the bias voltage generating circuit 11 requires to be provided with a low pass filter having a cut-off frequency corresponding to the peak frequency fp on the power source line 5.

That is, in the filter circuit 35 shown in FIG. 6, when a resistance value R of the resistance element 36 and a capacitance value C of the capacitor 37 are designed such that $fp=1/(2\pi \cdot R \cdot C)$, a frequency characteristic of the bias voltage generating circuit 11 can be made ideal as shown in FIG. 7D.

Figure 12:
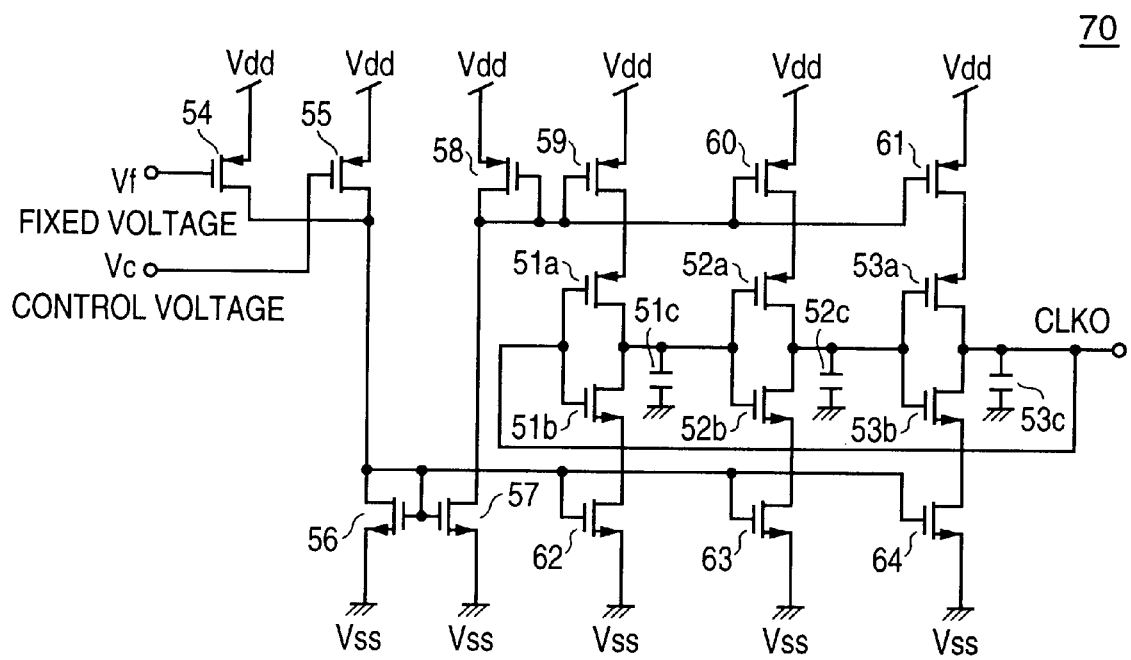
FIG. 12 is a circuit diagram representing a configuration of the prior art voltage-controlled oscillating circuit 70.
Figure 13:
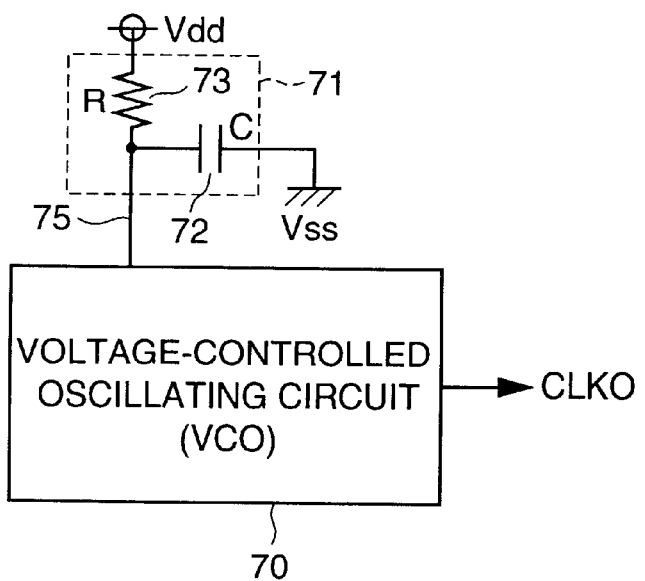
FIG. 13 is a circuit diagram representing a configuration of a filter circuit provided correspondingly to a power source voltage of the voltage-controlled oscillating circuit 70.

In this case, since the power source voltage Vdd is not supplied directly to the ring oscillator 20, a cut-off frequency of the filter circuit 35 can be set high compared with the prior art filter circuit 71 shown in FIG. 12. As a result, the filter circuit 35 can be smaller in size than the prior art filter circuit 71.

Furthermore, as described above, by adopting the operational amplifier 12 of a single-stage configuration excellent in frequency characteristics, the peak frequency fp can be set to the higher frequency side. By doing so, a capacitance value C of the capacitance 37 in the filter circuit 35 can be smaller, thereby enabling the capacitor 37 to be smaller in size.

In such a way, with a down-sized filter circuit adopted, an influence of power source noise can be further suppressed to generate the output clock CLKO stably in frequency and phase.

Figure 8:
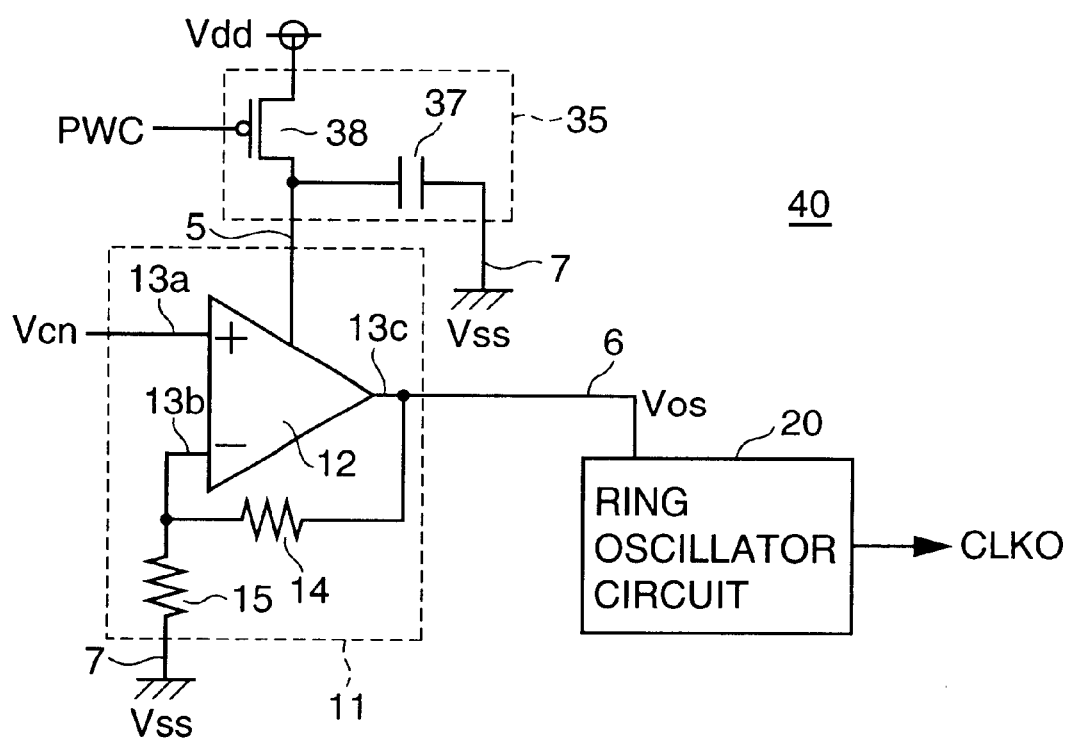
FIG. 8 is a diagram for representing another example configuration of a filter circuit 35.

Referring to FIG. 8, the filter circuit 35 according to another example configuration includes: a power supply transistor 38 coupled in series with the power source voltage 5; and a capacitor 37 coupled between the power source line 5 and the ground line 7. To the gate of the power supply transistor 38, inputted is a control signal PWC for instructing execution and cease of supply of the power source voltage Vdd to the operational amplifier 12. Thereby, in a period when operation of the operational amplifier 12 is unnecessary, the control signal PWC is inactivated to turn off the power supply transistor 38, thus enabling power consumption of the voltage-controlled oscillating circuit 40 to decrease.

On the other hand, in a period when the operational amplifier 12 operates, the control signal PWC is activated to turn on the power supply transistor 38 and supply the power source voltage Vdd to the operational amplifier 12. In this case, a low pass filter similar to FIG. 6 can be formed of an on-resistance of the power supply transistor 38 and a capacitor 37. As a result, in addition to suppression of power source noise, power consumption can be lowered by power supply control without scaling-up of the filter circuit 35.

Fourth Embodiment

In the fourth embodiment, description will be given of a variation of configuration of an operational amplifier circuit constituted by the operational amplifier 12 in the bias voltage generating circuit 11.

Figure 9:
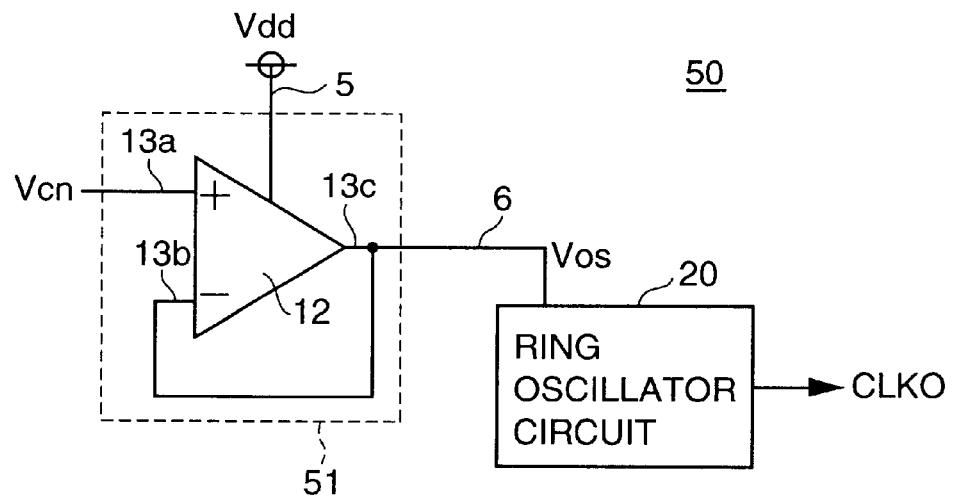
FIG. 9 is a block diagram representing a configuration of a voltage-controlled oscillating circuit 50 according to a fourth embodiment of the present invention.

Referring to FIG. 9, a voltage-controlled oscillating circuit 50 according to the fourth embodiment of the present invention differs from the voltage-controlled oscillating circuit 10 shown in FIG. 2 comparing therewith in that a bias voltage generating circuit 51 is provided instead of the bias voltage generating circuit 11. A configuration and operation of the other constituents combined of the voltage-controlled oscillating circuit 50 are similar to the voltage-controlled oscillating circuit 10; therefore, neither of descriptions thereof is repeated.

The output terminal 13c of the operational amplifier 12 is coupled directly with the inverting input terminal 13b. On the other hand, to the input terminal 13a of the operational amplifier 12, the control voltage Vcn from the control circuit 3 is inputted. Hence, the bias voltage generating circuit 51 operates as a so-called voltage follower circuit.

In the bias voltage generating circuit 51, the bias voltage Vos corresponds to a state where Rs→∞ in the formula (1); therefore, Vos=Vcn. In such a way, the bias voltage generating circuit 51 does not amplify a voltage level of the control voltage Vcn, while being able to stably set the bias voltage Vos to the same level as the control voltage Vcn.

In an ideal case, an input impedance of the operational amplifier 12 increases to infinity but an output impedance becomes 0; therefore, the bias voltage generating circuit 51 can stably generates the bias voltage Vos of the same level as the control voltage Vcn without suffering from influences of a circuit group connected thereto at the previous and subsequent stages.

Hence, by stably controlling the oscillating frequency fosc of the output clock CLKO according to the control voltage Vcn, the output clock CLKO having a small variation in phase can be generated.

Modification of the Fourth Embodiment

Figure 10:
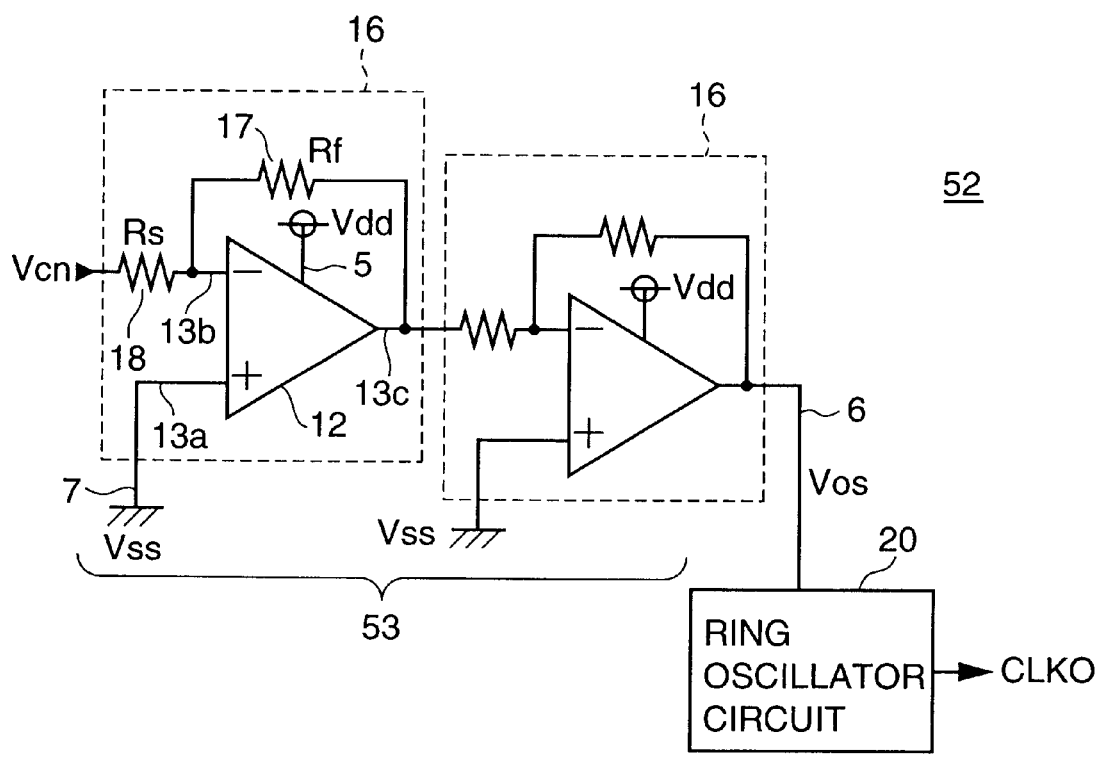
FIG. 10 is a block diagram representing a configuration of a voltage-controlled oscillating circuit 52 according to a modification of the fourth embodiment.

Referring to FIG. 10, a voltage-controlled oscillating circuit 52 according to the modification of the fourth embodiment differs from the voltage-controlled oscillating circuit 10 shown in FIG. 2 in configuration comparing therewith in that a bias voltage generating circuit 53 is included instead of the bias voltage generating circuit 11. A configuration and operation of the other constituents combined of the voltage-controlled oscillating circuit 52 are similar to the voltage-controlled oscillating circuit 10, therefor, neither of detailed descriptions thereof is repeated.

The bias voltage generating circuit 53 has two inverting amplifier circuits 16 connected in series to each other. An inverting amplifier circuit 16 includes: the operational amplifier 12; a resistance element 17 coupled between the output terminal 13c of the operational amplifier 12 and the inverting input terminal 13b thereof; and a resistance element 18 connected to the inverting input terminal 13b. The non-inverting input terminal 13a of the operational amplifier 12 is coupled with the ground line 7. The control voltage Vcn from the control circuit 3 is inputted to the inverting input terminal 13b via the resistance element 18.

In the inverting amplifier circuit 16, if resistance values of the resistance elements 17 and 18 are Rf and Rs, respectively, by definition, a relationship between an input voltage Vi corresponding to the control voltage Vcn and an output voltage Vo at the output terminal 13c is given by a formula (2) as follows:

$$Vo=-(Rf/Rs)\cdot Vi \qquad (2)$$

In such a way, in each of the inverting amplifier circuits 16, the output voltage Vo is inverted from the input voltage Vi in polarity. Moreover, in this embodiment, an amplification factor of each of the inverting amplifier circuits 16 is set 1 or less. That is, a relation Rf≦Rs is set.

Accordingly, by coupling the two (or an even number of) inverting amplifier circuits 16 in series to each other in such a way, a voltage value according to and lower than the control voltage Vcn can be supplied to the ring oscillator 20 as the bias voltage Vos.

Such a configuration is suited for a case where a range of oscillating frequencies in the ring oscillator circuit 20 is unnecessary to be so much wide but requirement is imposed of strict suppression of a variation in phase caused by power source noise. That is, by setting an amplification factor to 1 or less, an effect of suppressing an influence of power source noise is further enhanced.

Furthermore, it is possible that this case is not adopted where an even number of inverting amplifier circuits 16 are coupled in series cascade, but a configuration is adopted where a ring oscillator circuit with converted polarity arrangement is driven by a single inverting amplifier circuit 16.

With such a configuration adopted, a case can be coped with where a range of oscillating frequencies is narrow and requirement is imposed of strict suppression of a variation in phase due to an influence of power source noise or the like.

Fifth Embodiment

In the fifth embodiment, description will be given of a configuration of the operational amplifier 12 excellent in frequency characteristics employed in this embodiment of the present invention.

Figure 11:
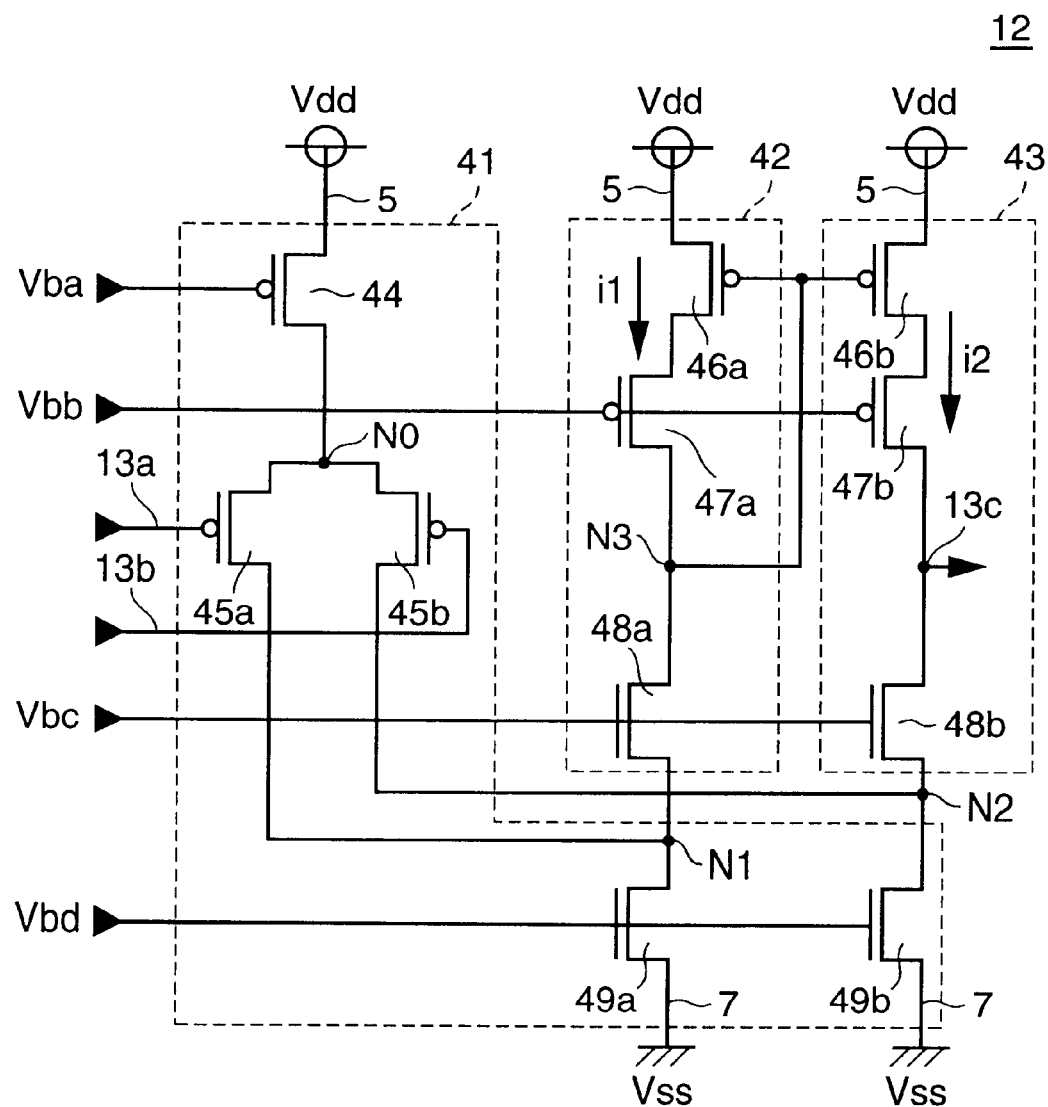
FIG. 11 is a circuit diagram representing an example configuration of an operational amplifier 12 according to a fifth embodiment of the present invention.

In FIG. 11, shown is an example configuration of an operational amplifier 12 according to this embodiment of the present invention.

In FIG. 11, shown is a configuration of an operational amplifier having a circuit configuration of a so-called folded cascode type.

Referring to FIG. 11, the operational amplifier 12 has a differential amplifier portion 41 differentially amplifying and converting a voltage difference between the non-inverting input terminal 13a and the inverting input terminal 13b into voltage levels at nodes N1 and N2; a first cascode amplifier portion 42 for forming a current path between the power source line 5 and the node N1; and a second cascode amplifier portion 43 for forming a current path between the power source line 5 and the node N2.

The differential amplifier portion 41 has: a P-channel transistor 44 electrically coupled between the power source line 5 and a node N0; a P-channel transistor 45a electrically coupled between the nodes N0 and N1 and having the gate coupled with the non-inverting input terminal 13a; and a P-channel transistor 45b electrically coupled between the nodes N0 and N2 and having the gate coupled with the inverting input terminal 13b.

The differential amplifier portion 41 further has: N-channel transistors 49a and 49b each electrically coupled between a corresponding one of the nodes N1 and N2, and the ground line 7. A common bias voltage Vbd are inputted to the gates of the transistors 49a and 49b.

The first cascode amplifier portion 42 has: P-channel transistors 46a and 47a electrically coupled in series between the power source line 5 and a node N3; and an N-channel transistor 48a electrically coupled between the nodes N3 and N1.

The second cascode amplifier portion 43 has: P-channel transistors 46b and 47b electrically coupled in series between the power source line 5 and the output terminal 13c outputting the bias voltage Vos; and an N-channel transistor 48b electrically coupled between the output terminal 13c and the node N2.

The gates of the transistors 46a and 46b are coupled with the node N3. A common bias voltage Vbb is inputted to the gates of the transistors 47a and 47b. A common bias Vbc is inputted to the gates of the transistors 48a and 48b. Hence, a current i2 flowing through the transistors 46b, 47b and 48b in this order is proportional to a current i1 flowing through the transistors 46a, 47a and 48a in this order. A proportion constant is determined according to a current drive ability ratio of the transistors.

The transistors 45a and 45b differentially operate according to voltage levels of the non-inverting input terminal 13a and the inverting input terminal 13b to alter voltage levels of the respective nodes N1 and N2. To be concrete, when a voltage level of the non-inverting input terminal 13a transitions to the relatively high side, then a voltage level of the node N1 goes low, while to the contrary, a voltage level of the node N2 goes high. To the contrary to this, when a voltage level of an input of the non-inverting input terminal 13a transitions to the relative low side, then voltage levels of the respective nodes N1 and N2 shift to the high side and the low side, respectively.

The current i1 and i2 alter according to a voltage level of the node N1. When a voltage level of the non-inverting input terminal 13a goes relatively high, the currents i1 and i2 increase to raise a voltage of the output terminal 13c, that is to raise the bias voltage Vos. To the contrary, when a voltage level of the non-inverting input terminal 13a goes relatively low, the currents i1 and i2 decrease to lower the bias voltage Vos as well.

In such a way, by adopting a circuit configuration of a folded cascode type, a gain (an amplification factor) can be attainable large in a single-stage operational amplifier low in possibility of oscillation.

Furthermore, current drive abilities of the transistors 45a, 46a, 47a, 48a and 49a for defining voltage levels of the nodes N1 and N3 can be set lower compared with the transistors 45b, 46b, 47b, 48b and 49b for defining voltage levels of the output terminal 13c generating the bias voltage Vos and the associated node N2. Generally speaking, adjustment of a current drive ability can be realized by adjusting a design of a transistor size. Accordingly, by reducing transistor sizes of the transistors 45a to 49a, a layout area of the operational amplifier 12 can be decreased.

Note that in the circuit configuration shown in FIG. 11, a configuration can be adopted where each of the transistors is inverted in polarity and the power source line 5 and the ground line 7 are interchanged therebetween in role. To be concrete, N-channel transistors are adopted as the transistors 44, 45a, 45b, 46a, 46b, 47a and 47b, while P-channel transistors are adopted as the transistors 48a, 48b, 49a and 49b, and furthermore, not only is a line to which the transistors 44, 46a and 46b are connected altered from the power source line 5 to the ground line 7, but a line to which the transistors 49a and 49b are connected is also altered from the ground line 7 to the power source line 5. Even in such a configuration, a similar function of the operational amplifier 12 shown in FIG. 11 can be realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage-controlled oscillating circuit receiving supply of a power source voltage to operate comprising:

a voltage generating circuit setting a voltage level of a bias voltage according to a control voltage being different from said power source voltage inputted from the outside, said voltage generating circuit including an operational amplifier, which is an amplifier of a single stage configuration, and receiving supply of said power source voltage to operate, said operational amplifier having
      first and second input terminals, wherein one of said first and second input terminals is electrically coupled with said control voltage, and
      an output terminal outputting said bias voltage, and
   said voltage generating circuit further including a) a feedback portion coupled between said output terminal and another one of said first and second input terminals and b) a non-inverting amplifier circuit using said operational amplifier receiving supply of said power source voltage to operate; and a ring oscillator circuit generating a clock having a frequency corresponding to said bias voltage, and having an odd-number of inverters, interconnected in a closed ring, and each inverter receiving supply of said bias voltage to operate, wherein each of said inverters includes a p-channel MOS transistor receiving said bias voltage at its source electrode.

2. A voltage-controlled oscillating circuit receiving supply of a power source voltage to operate comprising:

a voltage generating circuit setting a voltage level of a bias voltage according to a control voltage being different from said power source voltage inputted from the outside, said voltage generating circuit including an operational amplifier, which is an amplifier of a single stage configuration, and receiving supply of said power source voltage to operate, said operational amplifier having first and second input terminals, wherein one of said first and second input terminals is electrically coupled with said control voltage, and an output terminal outputting said bias voltage, and said voltage generating circuit further including a) a feedback portion coupled between said output terminal and another one of said first and second input terminals and b) an inverting amplifier circuit using said operational amplifier receiving supply of said power source voltage to operate; and a ring oscillator circuit generating a clock having a frequency corresponding to said bias voltage, and having an odd-number of inverters, interconnected in a closed ring, and each inverter receiving supply of said bias voltage to operate, wherein each of said inverters includes a p-channel MOS transistor receiving said bias voltage at its source electrode.

3. The voltage-controlled oscillating circuit according to claim 1 or 2, further comprising:

a bias voltage line, provided between said voltage generating circuit and said ring oscillator circuit and transmitting said bias voltage; and a low pass circuit, coupled with said bias voltage line, and for removing a high frequency component of said bias voltage.

4. The voltage-controlled oscillating circuit according to claim 1 or 2, further comprising:

a low pass circuit, coupled between a node supplying said power source voltage and said voltage generating circuit, and for removing a high frequency component of said power source voltage.

5. The voltage-controlled oscillating circuit according to claim 4, wherein a cut-off frequency of said low pass circuit is set according to frequency characteristics of said operational amplifier.

6. The voltage controlled oscillating circuit according to claim 1 or 2, wherein said operational amplifier further includes:

a differential amplifier portion, coupled between a first power source node supplying one of a ground voltage and said power source voltage and a second power source node supplying the other of said ground voltage and said power source voltage, and amplifying and converting a voltage difference between said first and second input terminals into a voltage difference between first and second nodes;

a first cascode amplifier portion forming a first current path between said first power source node and said first node; and a second cascode amplifier portion forming a second current path between said first power source node and said second node, wherein said output terminal is provided on said second current path, said first cascode amplifier portion alters a first current amount passing through said first current path according to a voltage level of said first node, and said second cascode amplifier portion alters a second current amount passing through said second current path in proportion to said first current amount.

7. The voltage-controlled oscillating circuit according to claim 6, wherein said first current amount is smaller than said second current amount.

8. The voltage-controlled oscillating circuit according to claim 6, wherein said differential amplifier portion has:

a first transistor, electrically coupled between said first power source node and said first node, and having a control terminal coupled with said first input terminal;

a second transistor, electrically coupled between said first power source node and said second node, and having a control terminal coupled with said second input terminal;

a third transistor, electrically coupled between said first node and said second power source node, and receiving a first voltage at a control terminal thereof; and a fourth transistor, electrically coupled between said second node and said second power source node, and receiving said first voltage at a control terminal thereof;

wherein said first cascode amplifier portion has:

a fifth transistor, electrically coupled between said first power source node and a third node, and having a control terminal coupled with said third node; and a sixth transistor, electrically coupled between said first node and said third node, and receiving a second voltage at a control terminal thereof;

and wherein said second cascode amplifier portion has:

a seventh transistor, electrically coupled between said first power source node and said output terminal, and having a control terminal coupled with said third node; and an eighth transistor, electrically coupled between said second node and said output terminal, and receiving said second bias voltage at a control terminal thereof.

9. The voltage-controlled oscillating circuit according to claim 8, wherein said first, third, fifth and sixth transistors have a first current drive ability and said second, fourth, seventh and eighth transistors have a second current drive ability, said first current drive ability being smaller than said second current drive ability.

10. A voltage-controlled oscillating circuit receiving a power source voltage to operate, comprising:

a voltage generating circuit receiving a control voltage and amplifying the control voltage at a prescribed amplification factor to generate a bias voltage of a voltage level different from that of said control voltage; and a ring oscillator circuit generating a clock having a frequency according to that of said bias voltage, and having an odd number of inverters interconnected in a closed ring and receives supply of said bias voltage at each of said inverters to operate, wherein said amplification factor is larger than 1, and said voltage generating circuit includes a non-inverting amplifier circuit using an operational amplifier receiving supply of said power source voltage to operate.

11. A voltage-controlled oscillating circuit receiving a power source voltage to operate, comprising:

a voltage generating circuit receiving a control voltage and amplifying the control voltage at a prescribed amplification factor to generate a bias voltage of a voltage level different from that of said control voltage; and a ring oscillator circuit generating a clock having a frequency according to that of said bias voltage, and having an odd number of inverters interconnected in a closed ring and receives supply of said bias voltage at each of said inverters to operate, wherein said amplification factor is small than 1, and said voltage generating circuit includes an inverting amplifier circuit using an operational amplifier receiving supply of said power source voltage to operate.

12. The voltage-controlled oscillating circuit according to claim 10 or 11, further comprising:

a bias voltage line, provided between said voltage generating circuit and said ring circuit, and transmitting said bias voltage; and a low pass circuit, coupled with said bias voltage line, and for removing a high frequency component of said bias voltage.

13. The voltage-controlled oscillating circuit according to claim 10 or 11, further comprising:

a low pass circuit, coupled between a node supplying said power source voltage and said voltage generating circuit, and for removing a high frequency component of said power source voltage.

14. A phase-locked loop circuit generating an output clock for operating an internal circuit in synchronism with a reference clock, comprising:

a phase comparator circuit comparing said reference clock with a feedback clock from said internal clock;

a control circuit setting a voltage level of a control voltage based on a phase comparison result of said phase comparator circuit; and a voltage-controlled oscillating circuit receiving supply of a power source voltage being different from said control voltage to operate and supply said output clock having a frequency according to said control voltage to said internal circuit, said voltage-controlled oscillating circuit including a voltage generating circuit setting a voltage level of a bias voltage according to said control voltage, said voltage generating circuit having an operational amplifier, which is an amplifier of a single stage configuration, and receiving supply of said power source voltage to operate, said operational amplifier having first and second input terminals, wherein one of said first and second input terminals is electrically coupled with said control voltage, and an output terminal outputting the bias voltage, and said voltage generating circuit further having a feedback portion coupled between said output terminal and another one of said first and second input terminals, and said voltage-controlled oscillating circuit further including a ring oscillator circuit generating a clock, as said output clock, having a frequency corresponding to that of said bias voltage, said ring oscillator circuit having an odd-number of inverters, interconnected in a closed ring, and each inverter receiving supply of said bias voltage to operate.

15. The phase-locked loop circuit according to claim 14, wherein the one of said first and second input terminals is electrically coupled with said control voltage via a resistor.

16. The phase-locked loop circuit according to claim 14, wherein an other one of said first and second input terminals is electrically coupled with a reference voltage.

17. The phase-locked loop circuit according to claim 14, wherein each of said inverters includes a p-channel MOS transistor receiving said bias voltage at its source electrode.

18. A voltage-controlled oscillating circuit receiving supply of a power source voltage to operate comprising:

a voltage generating circuit setting a voltage level of a bias voltage according to a control voltage being different from said power source voltage inputted from the outside, said voltage generating circuit including an operational amplifier, which is an amplifier of a single stage configuration, and receiving supply of said power source voltage to operate, said operational amplifier having first and second input terminals, wherein one of said first and second input terminals is electrically coupled with said control voltage, and an output terminal outputting said bias voltage, and said voltage generating circuit further including a feedback portion coupled between said output terminal and another one of said first and second input terminals; and a ring oscillator circuit generating a clock having a frequency corresponding to said bias voltage, and having an odd-number of inverters, interconnected in a closed ring, and each inverter receiving supply of said bias voltage to operate, wherein the one of said first and second input terminals is electrically coupled with said control voltage via a resistor.

19. A voltage-controlled oscillating circuit receiving supply of a power source voltage to operate comprising:

a voltage generating circuit setting a voltage level of a bias voltage according to a control voltage being different from said power source voltage inputted from the outside said voltage generating circuit including an operational amplifier, which is an amplifier of a single stage configuration, and receiving supply of said power source voltage to operate, said operational amplifier having first and second input terminals, wherein one of said first and second input terminals is electrically coupled with said control voltage, and an output terminal outputting said bias voltage, and said voltage generating circuit further including a feedback portion coupled between said output terminal and another one of said first and second input terminals; and a ring oscillator circuit generating a clock having a frequency corresponding to said bias voltage, and having an odd-number of inverters, interconnected in a closed ring, and each inverter receiving supply of said bias voltage to operate, wherein an other one of said first and second input terminals is electrically coupled with a reference voltage.

20. A voltage-controlled oscillating circuit receiving supply of a power source voltage to operate comprising:

voltage generating circuit setting a voltage level of a bias voltage according to a control voltage being different from said power source voltage inputted from the outside, said voltage generating circuit including an operational amplifier, which is an amplifier of a single stage configuration, and receiving supply of said power source voltage to operate, said operational amplifier having
- first and second input terminals, wherein one of said first and second input terminals is electrically coupled with said control voltage, and
- an output terminal outputting said bias voltage, and said voltage generating circuit further including a feedback portion coupled between said output terminal and another one of said first and second input terminals; and a ring oscillator circuit generating a clock having a frequency corresponding to said bias voltage, and having an odd-number of inverters, interconnected in a closed ring, and each inverter receiving supply of said bias voltage to operate, wherein each of said inverters includes a p-channel MOS transistor receiving said bias voltage at its source electrode.

* * * * *